United States Patent [19]
Cornett et al.

[11] Patent Number: 5,173,835
[45] Date of Patent: Dec. 22, 1992

[54] VOLTAGE VARIABLE CAPACITOR

[75] Inventors: Kenneth D. Cornett; E. S. Ramakrishnan; Gary H. Shapiro; Raymond M. Caldwell; Wei-Yean Howng, all of Albuquerque, N. Mex.

[73] Assignee: Motorola, Inc., Schaumburg, Ill.

[21] Appl. No.: 776,111

[22] Filed: Oct. 15, 1991

[51] Int. Cl.⁵ .................... H01G 7/00; H01L 17/00
[52] U.S. Cl. .................... 257/310; 361/280; 257/312; 437/180; 437/235
[58] Field of Search ............. 29/25.03; 361/277, 278, 361/280, 281; 357/14

[56] References Cited

U.S. PATENT DOCUMENTS

| | | | |
|---|---|---|---|
| 3,202,891 | 8/1965 | Frankl | 361/280 |
| 3,512,052 | 5/1970 | MacIver et al. | 357/23.6 |
| 3,634,738 | 1/1972 | Leith et al. | 357/14 |
| 3,648,340 | 3/1972 | MacIver | 29/25.42 |
| 3,809,971 | 5/1974 | Hluchan et al. | 361/524 |
| 3,890,635 | 6/1975 | Engeler | 357/14 |
| 4,005,466 | 1/1977 | Dawson | 357/14 |
| 4,782,350 | 11/1988 | Smith et al. | 346/140 R |

Primary Examiner—Donald A. Griffin
Attorney, Agent, or Firm—Dale W. Dorinski

[57] ABSTRACT

A voltage variable capacitor (10) has as the base substrate a silicon wafer with a layer of high resistivity semiconductor material on top of the substrate. An insulating layer (16) of a metal oxide having a dielectric constant greater than the dielectric constant of the semiconductors (12), such as zirconium titanate, is formed on top of the high resistivity layer, and a metal electrode (18) is formed on the insulating layer (16). When the electrode is energized, a depletion layer (20) is formed in the high resistivity layer. By varying the voltage applied to the electrode, the capacitance of the device is altered.

16 Claims, 5 Drawing Sheets

VOLTAGE VARIABLE CAPACITOR

TECHNICAL FIELD

This invention relates generally to capacitors, and more specifically to voltage variable capacitors, also known as varactors.

BACKGROUND

High quality, precisely controlled capacitors are an integral part of many semiconductor devices. Capacitors are fabricated as part of a semiconductor circuit by using the Metal Oxide Silicon (MOS) system. One particular use of semiconductor capacitors is in an integrated circuit whose function is the conversion of analog signals to digital representation. The analog-to-digital conversion is accomplished by a sequential comparison of a signal with fractions of a reference voltage. The reference is divided by applying the comparison through an array of capacitors having capacitances that are successively reduced by factors of two. For an analog-to-digital conversion circuit to function properly, the capacitors in the circuit must be precisely controlled over the entire capacitance value of the circuit. This is accomplished by placing an oxide, such as silicon oxide, over the semiconductor and then fabricating an electrode over the oxide in order to form the capacitor.

Another use for semiconductor capacitors is in applications requiring voltage variable capacitors (VVC) also known as varactors. Currently, varactors are used as voltage variable capacitors to tune the center frequency of electrical networks consisting of resistors, inductors, and capacitors. Varactors with large capacitance per unit area, large capacitance change, and low DC leakage currents are necessary to increase the dynamic range and efficiency of tuned resonators while using lower control voltages. In order to achieve these requirements, high performance VVC's must be used as discrete components in a hybrid package because the currently available high performance VVC's are not compatible with the MOS fabrication process. The performance of the varactor is limited by the electrical characteristics of the insulator, silicon oxide, used in conventional art VVC's. In order to achieve the necessary performance increase, an increased capacitance range must be realized. It would be highly advantageous if the dielectric material would be compatible with the MOS processing and also with bipolar processing schemes.

SUMMARY OF THE INVENTION

Briefly, according to the invention, there is provided a voltage variable capacitor. The capacitor has as the base substrate a silicon wafer with a layer of high resistivity semiconductor material on top of the substrate. An insulating layer of a metal oxide having a dielectric constant greater than the dielectric constant of the semiconductor is formed on top of the high resistivity layer, and a metal electrode is formed on the insulating layer. When the electrode is suitably energized, a depletion layer can be formed in the high resistivity layer.

DETAILED DESCRIPTION OF THE PREFERRED EMBODIMENT

A voltage variable capacitor or varactor is a semiconductor device characterized by voltage sensitive capacitance which resides in the space-charge region at the surface of a semiconductor bounded by an insulating layer. Varactors are also known as varactor diodes, variable capacitance diodes, varicaps and voltage variable capacitors (VVC's). In order for a VVC to function, a depletion layer must be formed. A depletion layer is a region of net space-charge in a semiconductor in which the density of mobile charge carriers is much less than the density of ionized impurity atoms. The mobile carrier charge density is insufficient to neutralize the fixed charged density of donors and acceptors. The depletion layer is also known as a barrier layer, a blocking layer, or a space-charged layer.

In order to fabricate an improved voltage variable capacitor with larger capacitance and lower DC leakage current, a novel arrangement of materials is necessary. A Metal-Insulator-Semiconductor (MIS) capacitor is formed, in which the relative dielectric constant of the insulator is much larger than the relative dielectric constant of the semiconductor depletion layer. The semiconductor itself is typically single crystal silicon, but may be other materials common to the art. The semiconductor may be heavily doped except for a high resistivity surface layer which is less heavily doped. The surface layer has a higher resistivity than the semiconductor substrate and may be a single crystal layer of silicon that is epitaxially grown on the semiconductor. It may also be a polysilicon layer or be counter-doped in comparison to the semiconductor.

Figure 1:
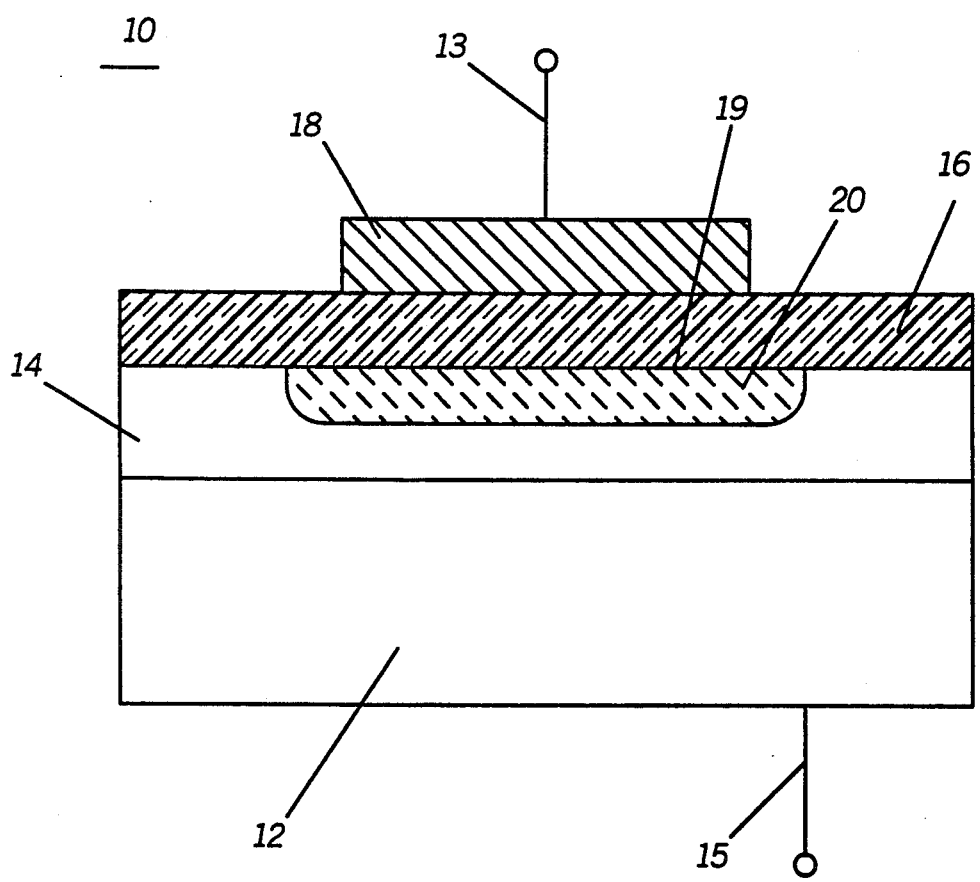
FIG. 1 is a cross-sectional view of a voltage variable capacitor in accordance with the present invention.

Referring now to FIG. 1, a voltage variable capacitor 10 is formed on a semiconductor 12. The surface layer 14, which is less heavily doped, has a higher resistivity than the semiconductor and serves as an area for the depletion layer to form. An insulator layer 16 is applied over the surface layer 14. The insulator layer 16 is preferably zirconium titanate ($ZrTiO_4$) applied in a thickness from 300 Ångstroms to 1000 Ångstroms, but thicknesses from 100 Ångstroms to 2 microns have been found to be suitable. The material employed as the dielectric or insulating layer should have a dielectric constant much greater than that of the semiconductor. Examples of suitable materials that may be used for this purpose are to be found in TABLE 1 below:

TABLE 1

| | |
|---|---|
| tantalum pentoxide | $Ta_2O_5$ |
| niobium pentoxide | $Nb_2O_5$ |
| zirconium oxide | $ZrO_2$ |
| titanium dioxide | $TiO_2$ |
| zirconium titanate | $ZrTiO_4$ |
| strontium titanate | $SrTiO_3$ |
| barium titanate | $BaTiO_3$ |
| lead titanate | $PbTiO_3$ |

TABLE 1-continued

| | |
|---|---|
| barium tetratitanate | $Ba_2Ti_9O_{20}$ |
| barium neodymium titanate | $BaNd_2Ti_5O_{14}$ |
| lead-zirconium titanate | $Pb(Zr,Ti)O_3$ |
| lead-lanthanum zirconium titanate | $(Pb,La)(Zr,Ti)O_3$ |
| lithium niobate | $LiNbO_3$ |
| strontium-baruim niobate | $(Sr,Ba)Nb_2O_6$ |

Oxides of additional elements such as molybdenum, tungsten and vanadium may also be expected to be useful, either alone or in combination with other elements.

When an appropriate reverse bias 13 is applied to a metal electrode 18, mobile minority charge carriers are attached to a semiconductor insulator interface 19, forming a space-charge or depletion layer 20, which extends for some distance into the conductor 14. This depletion layer behaves as a variable width capacitor which is electrically in series with the capacitor formed by the insulator layer 16. These two series capacitors serve to create a net capacitance effect that is affected by the changes of each individual capacitor. The electrode bias voltage controls the width of the depletion layer from zero at the accumulation threshold to a maximum thickness at the inversion threshold and thereby varies the total capacitance of the device. The insulator layer 16 serves to provide the spacing between the top electrode 18 and the depletion layer 20. The depletion layer is a transient layer formed when the bias voltage is applied to the capacitor through inputs 13 and 15. The layer 20 may be reduced in size or disappear when the applied voltage field is varied or removed. Although shown in the drawing as a distinct feature, the depletion layer 20 should not be regarded as a permanent mechanical feature of the device 10. The operation theory described herein is similar to that found in operation of metal-oxide-semiconductor capacitors.

At the inversion threshold voltage, enough charge carriers have been attracted to the semiconductor interface such that an inversion layer is formed. Increasing the voltage bias increases the width of the inversion layer, until the layer reaches a maximum width, beyond which the depletion layer cannot be substantially increased by increasing electrode bias voltage. The maximum depletion width is determined by the concentration of the impurity dopant near the semiconductor surface onto which the insulator layer 16 has been deposited. Dopants such as phosphorous, antimony, boron and arsenic will be recognized by those skilled in the art to be useful with silicon substrates. Other semiconductor substrates, such as gallium arsenide, may also be utilized to form a VVC in accordance with the invention.

The lower the doping, the larger the maximum depletion layer thickness, and thus, the lower minimum capacitance which can be achieved. The thickness of a less heavily doped surface layer may be chosen to be equal to or slightly greater than this maximum depletion width in order to minimize the series resistance of the device while maximizing the capacitance change.

Formation of an improved voltage variable capacitor is highly dependent upon the choice of the material comprising the insulator layer 16. By choosing a material with a much larger relative dielectric constant than the semiconductor depletion layer 20, a larger ratio of maximum-to-minimum capacitance will be obtained. The larger the insulator's dielectric constant, the larger the capacitance ratio in capacitance per unit area will be for a given insulator thickness. The ratio of maximum-to-minimum capacitance for a MIS capacitor is given by:

$$\frac{C_{max}}{C_{min}} = 1 + \left(\frac{K_{ins}W_d}{K_d W_{ins}}\right)$$

Where $C_{max}$ is the maximum capacitance, $C_{min}$ is the minimum capacitance, $K_{ins}$ is the relative dielectric constant of the insulator, $W_d$ is the width of the depletion layer, $K_d$ is the relative dielectric constant of the depletion layer, and $W_{ins}$ is the thickness of the insulating layer.

Many materials with very high dielectric constants have ferroelectric properties which are not desirable for high frequency devices. The polarization for a ferroelectric material has a hysteresis loop, or memory, whereby a residue polarization remains after an applied bias voltage has been removed. Thus, a residual depletion layer would also remain and thereby limit the capacitance ratio which may be obtained. These materials would be best utilized in lower frequency applications.

A low-loss, non-ferroelectric insulator layer is required for high frequency applications, specifically those for use in radio transmitting and receiving, and especially for tunable high-Q filters. Zirconium Titanate ($ZrTiO_4$) is one suitable non-ferroelectric material with a high relative dielectric constant ($K_r$ is approximately equal to 40) and low dielectric loss. By comparison, the relative dielectric constant of silicon dioxide (used in conventional MOS capacitors) is 3.9. The dielectric constant of the depletion layer in silicon is 11.7 and the dielectric constant of the depletion layer in germanium is 15.7. It can be easily seen that the dielectric constant of the zirconium titanate and the aforementioned materials in Table 1 is much larger than that of silicon dioxide, therefore an improved capacitor having higher capacitance ratio can be fabricated. Thin films of zirconium titanate can be formed by any of several techniques, including but not necessarily limited to, sputtering, evaporation, chemical vapor deposition, ion beam or plasma enhanced processes, sol-gel, and other solution chemistry processes.

By choosing an insulator with a much larger relative dielectric constant than a semiconductor depletion layer, a larger ratio between the maximum capacitance at zero depletion layer thickness and the minimum capacitance at the inversion threshold can be achieved. This strategy has been largely overlooked because the theory of MIS capacitors was developed with a silicon dioxide insulator on silicon. Because the maximum width of the depletion layer in an MIS capacitor is limited by the formation of an inversion layer, the capacitance change which can be achieved with a low dielectric constant material, such as silicon dioxide, is less than or comparable to what can be achieved by varying the depletion width around a PN junction.

In the case of a PN junction, the depletion layer has the same dielectric constant throughout and a depletion width that is controlled by the reverse bias voltage. The maximum width of this depletion layer capacitor is ultimately limited by the avalanche breakdown, which is also dependent on dopant concentration. In practice, however, these breakdown voltages are quite large and the maximum achievable depletion width is determined by the magnitude of the available bias voltage, typically ten volts or less for portable radio applications. The high dielectric constant, thin film capacitor requires a smaller bias control voltage than the varactor diode (0.5 to 3.0 volts for zirconium titanate) depending upon the insulator film thickness and the semiconductor doping, and it has lower leakage than a varator diode. The high K thin film MIS capacitors may be used in both bi-polar and MOS processes, whereas high-performance varactor diodes are not compatible with the MOS processes.

Figure 2A:
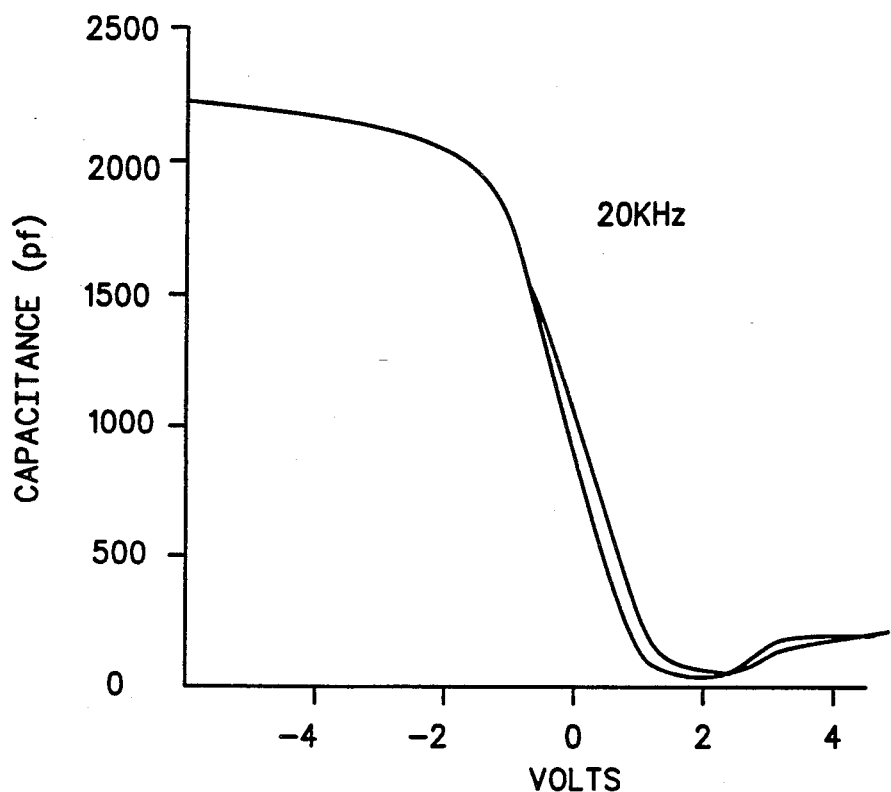
FIG. 2 is a graph of capacitance versus voltage at 20 KHz (FIG. 2a) and at 1 MHz (FIG. 2b) for devices in accordance with the present invention.
Figure 2B:
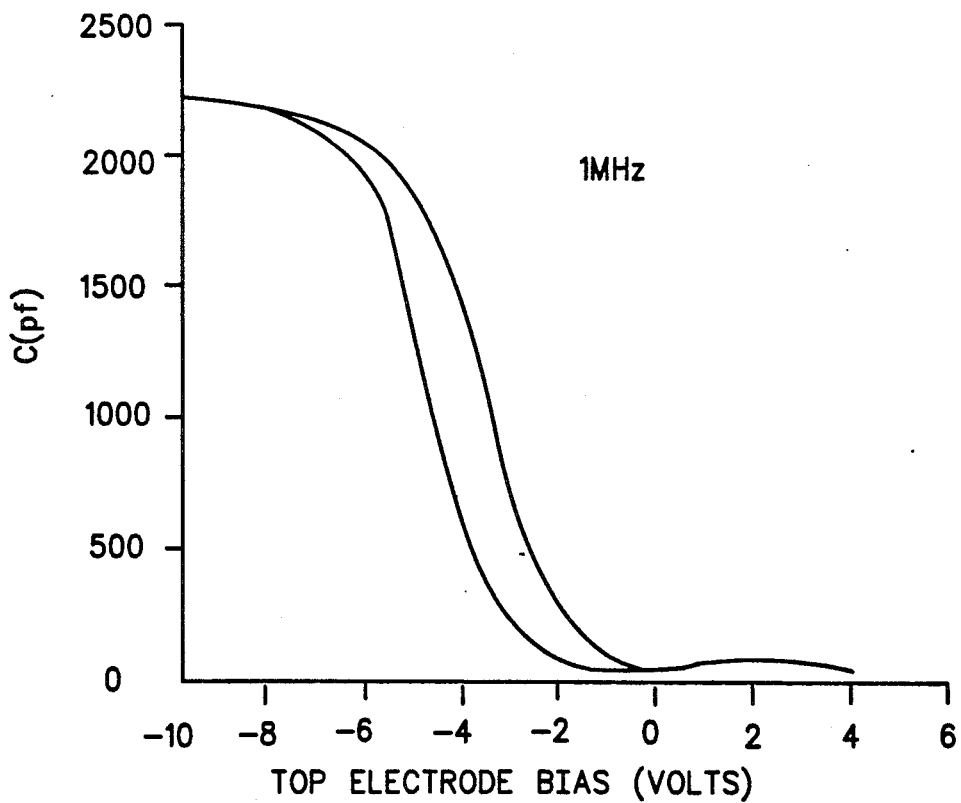

Referring now to FIG. 2, it may be seen that a very large capacitance change is noted over a small voltage range when a voltage variable capacitor is made using zirconium titanate as the insulating layer. A four-fold improvement has been made over the prior art. The current-voltage change is more linear than that observed in current varactors.

Figure 3:
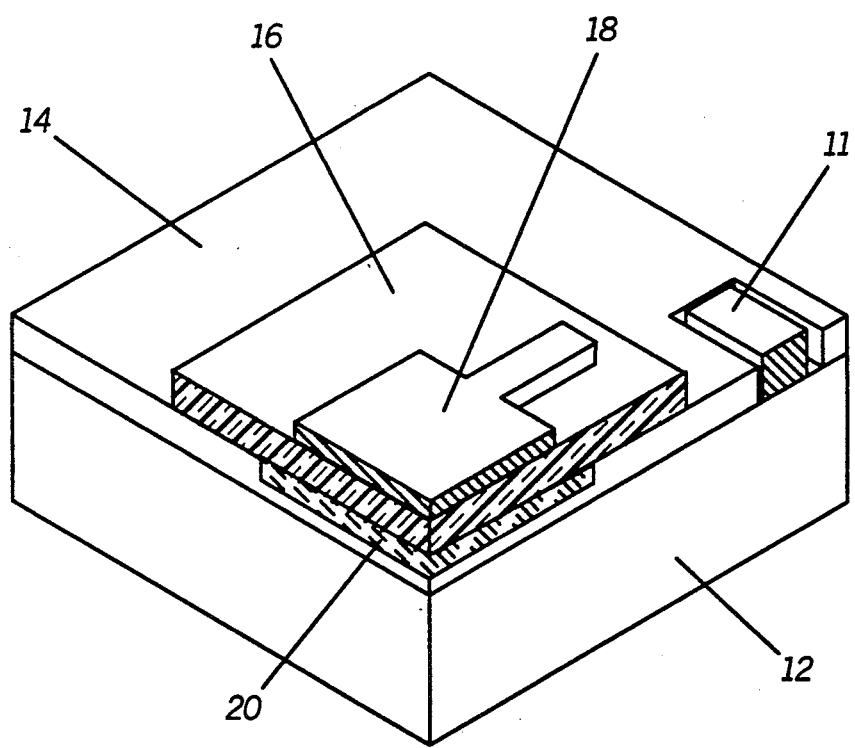
FIG. 3 is an isometric view of a voltage variable capacitor in an integrated circuit in accordance with the present invention.
Figure 4:
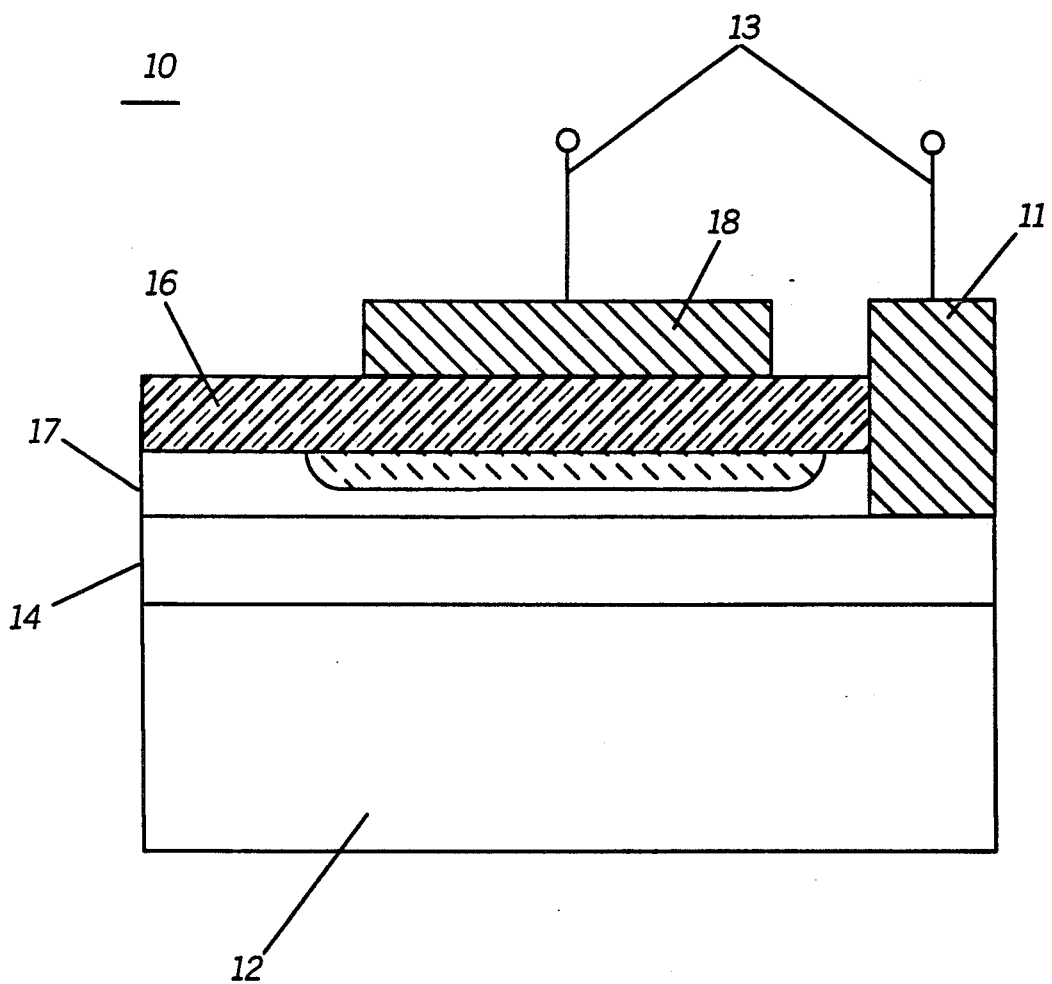
FIG. 4 is another embodiment of the present invention.

For help in understanding the structure of the aforementioned embodiments, the reader is referred to FIG. 3, a cut-away isometric view of a voltage-variable capacitor. Electrode 11 is used to provide electrical connection with the silicion substrate 12 and ultimately to the epitaxial layer 14 in order to form the depletion layer 20. An alternate embodiment of the invention is shown in FIG. 4, wherein an additional very thin layer 17 of doped material is used in addition to the conventional epitaxial layer. This very thin layer may also be made from polysilicon. Electrical contact to the thin layer is made through electrode 11 by electrically connecting the outputs 13 of the device. Obviously, such a capacitor as described herein may be easily incorporated into an integrated circuit.

Figure 5:
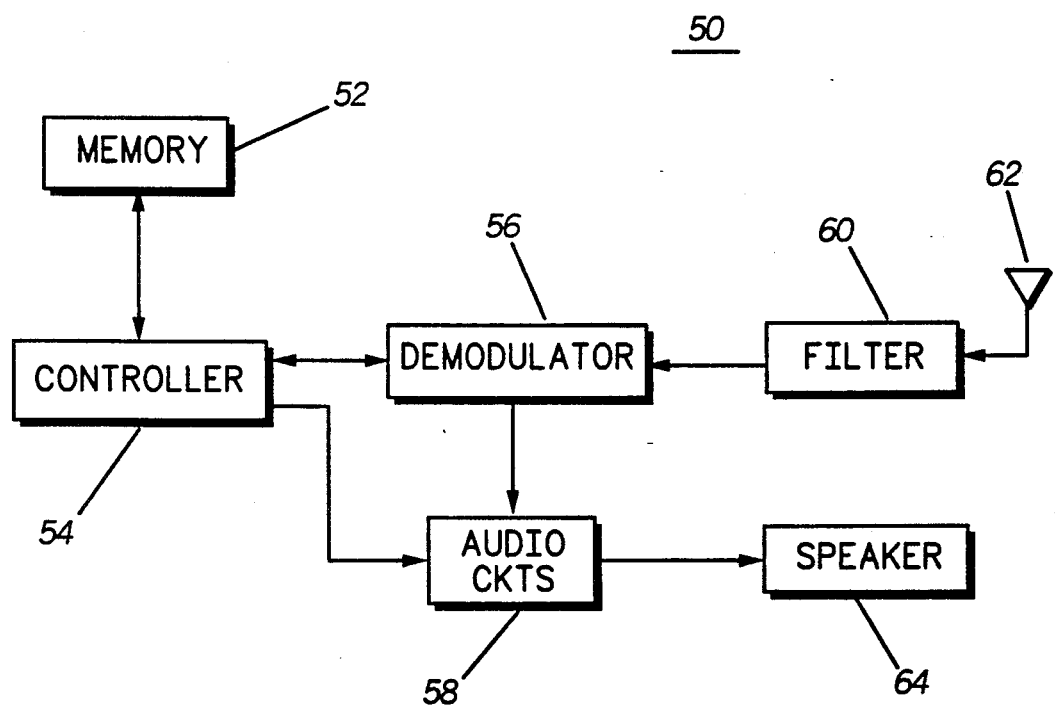
FIG. 5 is a block diagram of a communication device incorporating the voltage variable capacitor in accordance with the invention.

Applications requiring voltage variable capacitors that function at high frequencies, such as radio frequency communications equipment, will find particular use for a device as described herein. Radios utilize resonator networks or circuits that may be turned by a voltage variable capacitor, and those operating at high frequencies realize significant advantages from a voltage variable capacitor that has low loss, high Q, and large capacitance range. Referring to FIG. 5, a block diagram of the electrical components of the radio or communication device 50 is shown. The radio 50 includes a demodulator 56 coupled to the antenna 62 via a filter(s) 60. The operation of the radio 50 is controlled by a controller 54 which includes the memory block 52. The controller 54 communicates to the demodulator 56 and controls the audio circuit block 58. The demodulated signal from the demodulator 56 is coupled to a speaker 64 via the audio circuit 58. The combination of the memory block 52, the controller 54, demodulator 56, and the filter 60 constitutes a receiver means in the communication device 50. The voltage variable capacitors as described herein will preferably find application in the filter 60, but may also be utilized in the demodulater 56 and/or the audio circuits 58.

In summary, it may be seen that an improved voltage variable capacitor is attained by the use of insulator layer such as zirconium titanate having a high dielectric constant. The foregoing examples are intended to serve as an illustration of the preferred embodiment of the invention. Accordingly, it is not intended that the invention be limited except as by the appended claims herein.

What is claimed is:

1. A voltage variable capacitor, comprising:
 a semiconductor having a layer of semiconductive material of a higher resistivity than the semiconductor;
 a depletion layer formed in the high resistivity layer;
 an insulating layer formed on the high resistivity layer, said insulating layer being a metal oxide having a dielectric constant greater than the dielectric constant of the semiconductor; and
 an conductive electrode formed on the dielectric layer.

2. A voltage variable capacitor, comprising:
 a semiconductor having a layer of semiconductive material of a higher resistivity than the semiconductor;
 a depletion layer formed in the high resistivity layer;
 an insulating layer formed on the high resistivity layer, wherein said insulating layer is a metal oxide compound wherein the metal comprises at least first and second components selected from the group consisting of barium, lead, lithium, molybdenum, neodymium, niobium, strontium, tantalum, titanium, tungsten, vanadium, and zirconium, the insulating layer having a dielectric constant greater than the dielectric constant of the semiconductor; and
 a conductive electrode formed on the insulating layer.

3. A voltage variable capacitor, comprising:
 a semiconductor having a layer of semiconductive material of a higher resistivity than the semiconductor;
 a depletion layer formed in the high resistivity layer;
 an insulating layer formed on the high resistivity layer, wherein said insulating layer is an oxide selected from the group consisting of oxides of barium, lead, lithium, molybdenum, neodymium, niobium, strontium, tantalum, titanium, tungsten, vanadium, and zirconium, the insulating layer having a dielectric constant greater than the dielectric constant of the semiconductor; and
 a conductive electrode formed on the insulating layer.

4. The voltage variable capacitor as described in claim 1, wherein the insulating layer comprises zirconium titanate.

5. The voltage variable capacitor as described in claim 1, wherein the insulating layer has a dielectric constant greater than 16.

6. The voltage variable capacitor as described in claim 1, wherein the insulating layer further comprises a low-loss, non-ferroelectric insulator.

7. The voltage variable capacitor as described in claim 1, wherein the dielectric constant of the insulating layer is greater than the dielectric constant of the high resistivity semiconductor material.

8. An integrated circuit having a voltage variable capacitor, said circuit comprising:
 a semiconductor having a layer of semiconductive material of a higher resistivity than the semiconductor;
 a depletion layer formed in the high resistivity layer;
 an insulating layer formed on the high resistivity layer, said insulating layer being a metal oxide having a dielectric constant greater than the dielectric constant of the semiconductor; and
 a conductive electrode formed on the insulating layer.

9. A voltage variable thin film capacitor, comprising;
 a semiconductor having a layer of a high resistivity semiconductive material thereon;

an insulating layer formed on the high resistivity layer, comprising:
a thin film of zirconium titanate;
a metal electrode formed on the zirconium titanate; and
a depletion layer formed in the high resistivity layer upon electrically energizing the capacitor.

10. An insulating layer for a voltage variable capacitor, comprising a low-loss non-ferroelectric material having a dielectric constant equal to or greater than 40.

11. An insulating layer for a voltage variable capacitor, comprising a low-loss non-ferroelectric material having a dielectric constant equal to or greater than 40, wherein the insulating layer is a metal oxide wherein the metal comprises at least first and second components selected from the group consisting of barium, lead, lithium, molybdenum, neodymium, niobium, strontium, tantalum, titanium, tungsten, vanadium, and zirconium.

12. An insulating layer for a voltage variable capacitor, comprising a low-loss non-ferroelectric material having a dielectric constant equal to or greater than 40, wherein the insulating layer is an oxide selected from the group consisting of oxides of barium, lead, lithium, molybdenum, neodymium, niobium, strontium, tantalum, titanium, tungsten, vanadium, and zirconium.

13. The insulating layer as defined in claim 10, wherein the material comprises zirconium titanate.

14. A method of making a voltage variable capacitor, comprising the steps of:
depositing a high resistivity layer of semiconductive material on a semiconductor having the same conductivity type;
depositing a layer of a metal oxide, metal titanate or metal niobate insulating material having a dielectric constant greater than that of the semiconductor on the surface of the high resistivity layer;
forming an electrode on the insulating material; and
applying a voltage to the electrode in order to form a depletion layer in the high resistivity layer.

15. The method according to claim 14, wherein the step of coating comprises coating by sputtering, evaporation, chemical vapor deposition, ion beam, plasma, sol-gel, or solution chemistry processes.

16. A radio having a resonator, said resonator comprising: at least one voltage variable capacitor comprising:
a semiconductor substrate having a layer of a high resistivity semiconductive material thereon;
a depletion layer formed in the high resistivity layer;
an insulating layer formed on the high resistivity layer, comprising a thin film of zirconium titanate; and
an electrode formed on the zirconium titanate in an area directly above the depletion layer.

* * * * *